US011177386B2

(12) United States Patent
Cao et al.

(10) Patent No.: US 11,177,386 B2
(45) Date of Patent: Nov. 16, 2021

(54) THIN FILM TRANSISTOR AND DISPLAY APPARATUS

(71) Applicants: BOE Technology Group Co., Ltd., Beijing (CN); Hefei Xinsheng Optoelectronics Technology Co., Ltd., Anhui (CN)

(72) Inventors: Binbin Cao, Beijing (CN); Haijiao Qian, Beijing (CN); Chengshao Yang, Beijing (CN); Yinhu Huang, Beijing (CN)

(73) Assignees: BOE Technology Group Co., Ltd., Beijing (CN); Hefei Xinsheng Optoelectronics Technology Co., Ltd., Anhui (CN)

(*) Notice: Subject to any disclaimer, the term of this patent is extended or adjusted under 35 U.S.C. 154(b) by 501 days.

(21) Appl. No.: 16/099,506

(22) PCT Filed: Nov. 22, 2017

(86) PCT No.: PCT/CN2017/112291
§ 371 (c)(1),
(2) Date: Nov. 7, 2018

(87) PCT Pub. No.: WO2019/100243
PCT Pub. Date: May 31, 2019

(65) Prior Publication Data
US 2021/0226065 A1 Jul. 22, 2021

(51) Int. Cl.
H01L 29/00 (2006.01)
H01L 29/786 (2006.01)
H01L 29/66 (2006.01)

(52) U.S. Cl.
CPC .... H01L 29/78618 (2013.01); H01L 29/6675 (2013.01); H01L 29/7869 (2013.01); H01L 29/78669 (2013.01); H01L 29/78678 (2013.01)

(58) Field of Classification Search
None
See application file for complete search history.

(56) References Cited

U.S. PATENT DOCUMENTS

| 8,759,917 | B2 * | 6/2014 | Park | H01L 29/78606 257/347 |
| 2007/0284580 | A1 * | 12/2007 | Lim | H01L 29/78609 257/66 |
| 2009/0050896 | A1 | 2/2009 | Kaitoh et al. | |
| 2009/0065777 | A1 | 3/2009 | Oue et al. | |
| 2009/0224247 | A1 | 9/2009 | Kaitoh et al. | |

FOREIGN PATENT DOCUMENTS

CN 101387805 A 3/2009
JP H08330592 A 12/1996

OTHER PUBLICATIONS

International Search Report & Written Opinion dated Jul. 30, 2018, regarding PCT/CN2017/112291.

* cited by examiner

Primary Examiner — Reema Patel
(74) Attorney, Agent, or Firm — Intellectual Valley Law, P.C.

(57) ABSTRACT

The present application discloses a thin film transistor having an active layer including a channel part, a source contact part, and a drain contact part. At least one of the source contact part and the drain contact part has a contacting edge having one or more irregularities along the contacting edge.

17 Claims, 10 Drawing Sheets

THIN FILM TRANSISTOR AND DISPLAY APPARATUS

CROSS-REFERENCE TO RELATED APPLICATION

This application is a national stage application under 35 U.S.C. § 371 of International Application No. PCT/CN2017/112291, filed Nov. 22, 2017, the contents of which are incorporated by reference in the entirety.

TECHNICAL FIELD

The present invention relates to display technology, more particularly, to a thin film transistor and a display apparatus.

BACKGROUND

Display apparatuses such as liquid crystal display (LCD) apparatuses and organic light-emitting diode (OLED) display apparatuses have been widely used. LCD and OLED display devices use thin film transistor (TFT) to control pixels in the display panel. Examples of TFT include amorphous silicon TFT, polycrystalline silicone TFT, single crystal silicon TFT, metal oxide TFT, as well as organic semiconductor TFT.

SUMMARY

In one aspect, the present invention provides a thin film transistor, comprising an active layer having a channel part, a source contact part, and a drain contact part; wherein at least one of the source contact part and the drain contact part has a contacting edge having one or more irregularities along the contacting edge.

Optionally, the one or more irregularities comprise one or more concave portions along the contacting edge, one or more convex portions along the contacting edge, or a combination of one or more concave portions and one or more convex portions along the contacting edge.

Optionally, the one or more irregularities comprise alternating concave portions and convex portions along the contacting edge.

Optionally, both the source contact part and the drain contact part have the contacting edge having the one or more irregularities along the contacting edge.

Optionally, the thin film transistor further comprises a source electrode and a drain electrode on the active layer; wherein the contacting edge of the source contact part is electrically connected to the source electrode; and the contacting edge of the drain contact part is electrically connected to the drain electrode.

Optionally, the contacting edge of the source contact part is in contact with the source electrode; and the contacting edge of the drain contact part is in contact with the drain electrode.

Optionally, the thin film transistor further comprises an amorphous silicon layer between the source electrode and the contacting edge of the source contact part and between the drain electrode and the contacting edge of the drain contact part; wherein the contacting edge of the source contact part and the contacting edge of the drain contact part are in contact with the amorphous silicon layer.

Optionally, the thin film transistor further comprises an n+ doped amorphous silicon layer between the amorphous silicon layer and the source electrode and between the amorphous silicon layer and the drain electrode.

Optionally, the active layer extends substantially along an extension direction from the source electrode to the drain electrode; and the one or more irregularities are along a portion of the contacting edge extending along a direction non-parallel to the extension direction of the active layer.

Optionally, the portion of the contacting edge extends along a direction substantially orthogonal to the extension direction of the active layer.

Optionally, the active layer extends substantially along an extension direction from the source electrode to the drain electrode; and the one or more irregularities are along a portion of the contacting edge extending along a direction substantially parallel to the extension direction of the active layer.

Optionally, the active layer extends substantially along an extension direction from the source electrode to the drain electrode; and the one or more irregularities are along a first portion of the contacting edge extending along a direction non-parallel to the extension direction of the active layer and along a second portion of the contacting edge extending along a direction substantially parallel to the extension direction of the active layer.

Optionally, a cross-section of at least one of the one or more irregularities along a plane substantially parallel to a surface of the active layer have a polygonal shape.

Optionally, a cross-section of at least one of the one or more irregularities along a plane substantially parallel to a surface of the active layer have a round shape.

Optionally, the thin film transistor is a bottom gate-type thin film transistor comprising a gate electrode on a base substrate; and a gate insulating layer on a side of the gate electrode distal to the base substrate; wherein the active layer is on a side of the gate insulating layer distal to the gate electrode.

Optionally, the thin film transistor further comprises an etch stop layer on the channel part.

Optionally, the thin film transistor further comprises an etch stop layer on the active layer and conformal with the source contact part and the drain contact part.

Optionally, the active layer comprises a metal oxide semiconductor material.

Optionally, the active layer comprises an amorphous silicon or a polycrystalline silicon.

In another aspect, the present invention provides a display apparatus comprising the thin film transistor described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
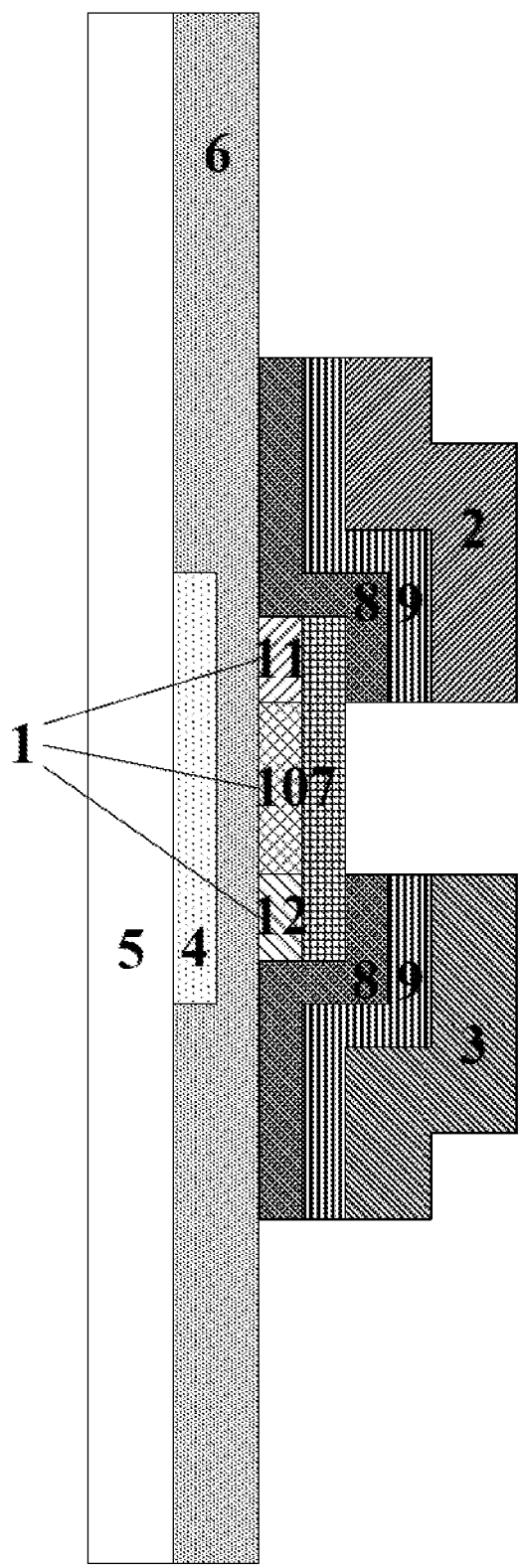
FIG. 1 is a schematic diagram illustrating the structure of a thin film transistor in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Thin film transistors include top gate-type thin film transistor and bottom gate-type thin film transistors. Typically, a top gate-type thin film transistor requires a more complicated fabricating process as compared to that of a bottom gate-type thin film transistor. For example, a top gate-type low temperature polycrystalline silicon thin film transistor requires 9 to 11 mask plates in the fabrication process whereas a bottom gate-type low temperature polycrystalline silicon thin film transistor requires only 4 to 6 mask plates. Often, a bottom gate-type thin film transistor includes an etch stop layer on the active layer to protect the active layer in the etching process of source electrode and drain electrode. Due to the presence of the etch stop layer in some bottom gate-type thin film transistors, the contact area between the active layer and the source and drain electrodes are limited to a contacting edge of the active layer. Because the low temperature polycrystalline silicon has a thickness typically in the range of 50 nm to 150 nm, this results in a relatively small contacting area between the active layer and the source and drain electrodes. Due to this relatively small contacting area, the turn-on current of the thin film transistor is limited to a relatively small value, defeating the purpose of using the polycrystalline silicon having a relatively high mobility rate. A similar problem exists in thin film transistor having an active layer made of other materials (e.g., metal oxides, amorphous silicon, etc.) and top gate-type thin film transistors.

Accordingly, the present disclosure provides, inter alia, a thin film transistor and a display apparatus that substantially obviate one or more of the problems due to limitations and disadvantages of the related art. In one aspect, the present disclosure provides a thin film transistor having an active layer. In some embodiments, the active layer includes a channel part, a source contact part, and a drain contact part. Optionally, at least one of the source contact part and the drain contact part has a contacting edge having one or more irregularities along the contacting edge. As used herein, the term "irregularity" refers to an intentionally formed shape or part providing certain effects, excluding unintentional shapes or parts such as defects or flaws. Optionally, the one or more irregularities include one or more concave portions along the contacting edge. Optionally, the one or more irregularities include one or more convex portions along the contacting edge. Optionally, the one or more irregularities include a combination of one or more concave portions and one or more convex portions along the contacting edge.

FIG. 1 is a schematic diagram illustrating the structure of a thin film transistor in some embodiments according to the present disclosure. Referring to FIG. 1, the thin film transistor in some embodiments includes a base substrate 5, a gate electrode 4 on the base substrate 5, a gate insulating layer 6 on a side of the gate electrode 4 distal to the base substrate 5, an active layer 1 on a side of the gate insulating layer 6 distal to the gate electrode 4, an etch stop layer 7 on a side of the active layer 1 distal to the gate insulating layer 6, an amorphous silicon layer 8 on a side of the active layer 1 and the etch stop layer 7 distal to gate insulating layer 6, an n+ doped amorphous silicon layer 9 on a side of the amorphous silicon layer 8 distal to the gate insulating layer 6, and a source electrode 2 and a drain electrode 3 on a side of the n+ doped amorphous silicon layer 9 distal to the amorphous silicon layer 8. The active layer 1 includes a channel part 10, a source contact part 11, and a drain contact part 12. The source contact part 11 is in contact with the amorphous silicon layer 8 along a contacting edge of the source contact part 11. The drain contact part 12 is in contact with the amorphous silicon layer 8 along a contacting edge of the drain contact part 12. The source contact part 11 is electrically connected to the source electrode 2 through the amorphous silicon layer 8 and the n+ doped amorphous silicon layer 9. The drain contact part 12 is electrically connected to the drain electrode 3 through the amorphous silicon layer 8 and the n+ doped amorphous silicon layer 9. An orthographic projection of the etch stop layer 7 on the base substrate 5 covers an orthographic projection of the channel part 10 on the base substrate 5. As shown in FIG. 1, the orthographic projection of the etch stop layer 7 on the base substrate 5 substantially overlaps with the orthographic projection of the active layer 1 on the base substrate 5, e.g., the orthographic projection of the etch stop layer 7 on the base substrate 5 substantially overlaps with a combination of orthographic projections of the channel part 10, the source contact part 11, and the drain contact part 12 on the base substrate 5. Optionally, the etch stop layer 7 is conformal with the source contact part 11 and the drain contact part 12. Optionally, the etch stop layer 7 is conformal with the source contact part 11, the drain contact part 12, and the channel part 10. In one example, the source contact part 11 has a substantially the same outer contour as a first part of the etch stop layer 7, and the drain contact part 12 has a substantially the same outer contour as a second part of the etch stop layer 7, and the channel part 10 has a substantially the same outer contour as a third part of the etch stop layer 7. In another example, an orthographic projection of the outer contour of the source contact part 11 on the base substrate 5 substantially overlaps with an orthographic projection of the outer contour of the first part of the etch stop layer 7 on the base substrate 5, an orthographic projection of the outer contour of the drain contact part 12 on the base substrate 5 substantially overlaps with an orthographic projection of the outer contour of the second part of the etch stop layer 7 on the base substrate 5, and an orthographic projection of the outer contour of the channel part 10 on the base substrate 5 substantially overlaps with an orthographic projection of the outer contour of the third part of the etch stop layer 7 on the base substrate 5.

In the thin film transistor of FIG. 1, the electrical connection between the source contact part 11 and the source electrode 2 is established through the amorphous silicon layer 8 and the n+ doped amorphous silicon layer 9, and the electrical connection between the drain contact part 12 and the drain electrode 3 is established through the amorphous silicon layer 8 and the n+ doped amorphous silicon layer 9. The source contact part 11 is not in direct contact with the source electrode 2, and the drain contact part 12 is not in direct contact with the drain electrode 3. The contacting areas between the source contact part 11 and the amorphous silicon layer 8 and between the drain contact part 12 and the amorphous silicon layer 8 are relatively small areas, limiting the turn-on current of the thin film transistor.

Figure 2:
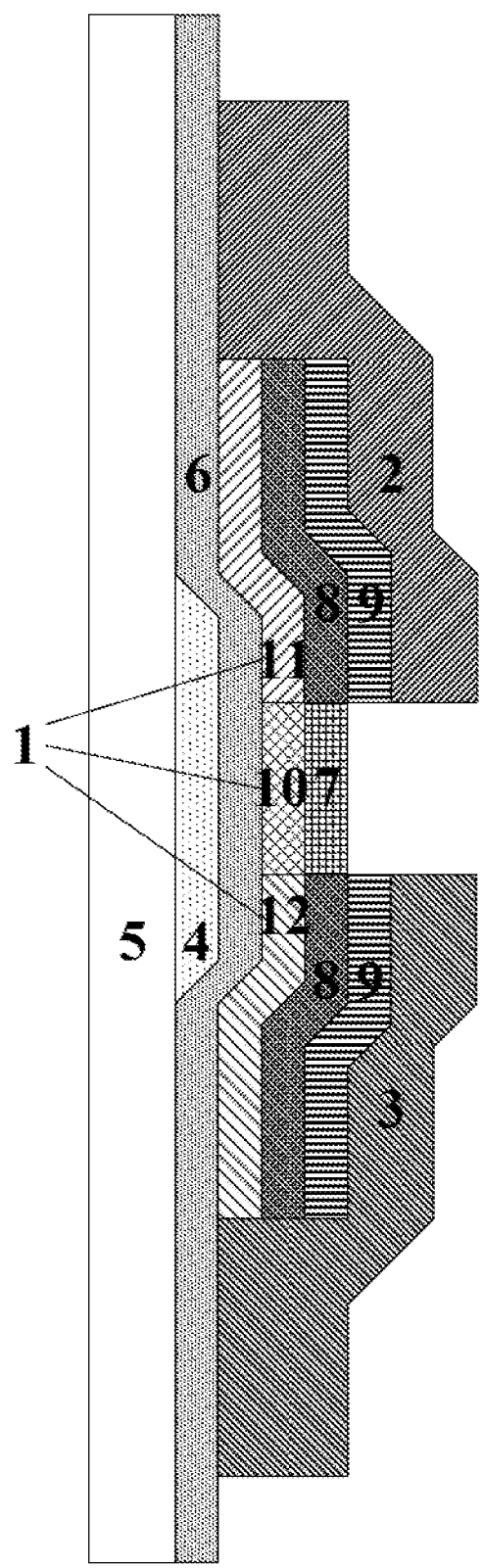
FIG. 2 is a schematic diagram illustrating the structure of a thin film transistor in some embodiments according to the present disclosure.

FIG. 2 is a schematic diagram illustrating the structure of a thin film transistor in some embodiments according to the present disclosure. The thin film transistor in FIG. 2 has a structure similar to that in FIG. 1. In FIG. 2, however, the source contact part 11 is in direct contact with the amorphous silicon layer 8 (e.g., on the top surface of the source contact part 11) and in direct contact with the source electrode 2 (e.g., along the contacting edge of the source contact part 11); and the drain contact part 12 is in direct contact with the amorphous silicon layer 8 (e.g., on the top surface of the drain contact part 12) and in direct contact with the drain electrode 3 (e.g., along the contacting edge of the drain contact part 12). The contacting areas between the source contact part 11 and the source electrode 2 and between the drain contact part 12 and the drain electrode 3 are relatively small areas, limiting the turn-on current of the thin film transistor. In FIG. 2, an orthographic projection of the etch stop layer 7 on the base substrate 5 substantially overlaps with an orthographic projection of the channel part 10 on the base substrate 5.

To increase the contacting area of the source contact part 11 and the drain contact part 12, the source contact part 11 and the drain contact part 12 in some embodiments have a contacting edge having one or more irregularities along the contacting edge. Optionally, the one or more irregularities are one or more curved portions. Optionally, the one or more curved portions include one or more smoothly curved portions (e.g., without sharp edges or angles). Optionally, the one or more curved portion include one or more non-smoothly curved portions (e.g., an angled configuration). A cross-section of the irregularity along a plane substantially parallel to a surface (e.g., the top surface or the bottom surface) of the active layer may have any appropriate shape. Optionally, the shape is an irregular shape. Optionally, the shape is a regular shape such as a polygonal shape, a round shape (e.g., a half circular shape), etc.

Figure 3:
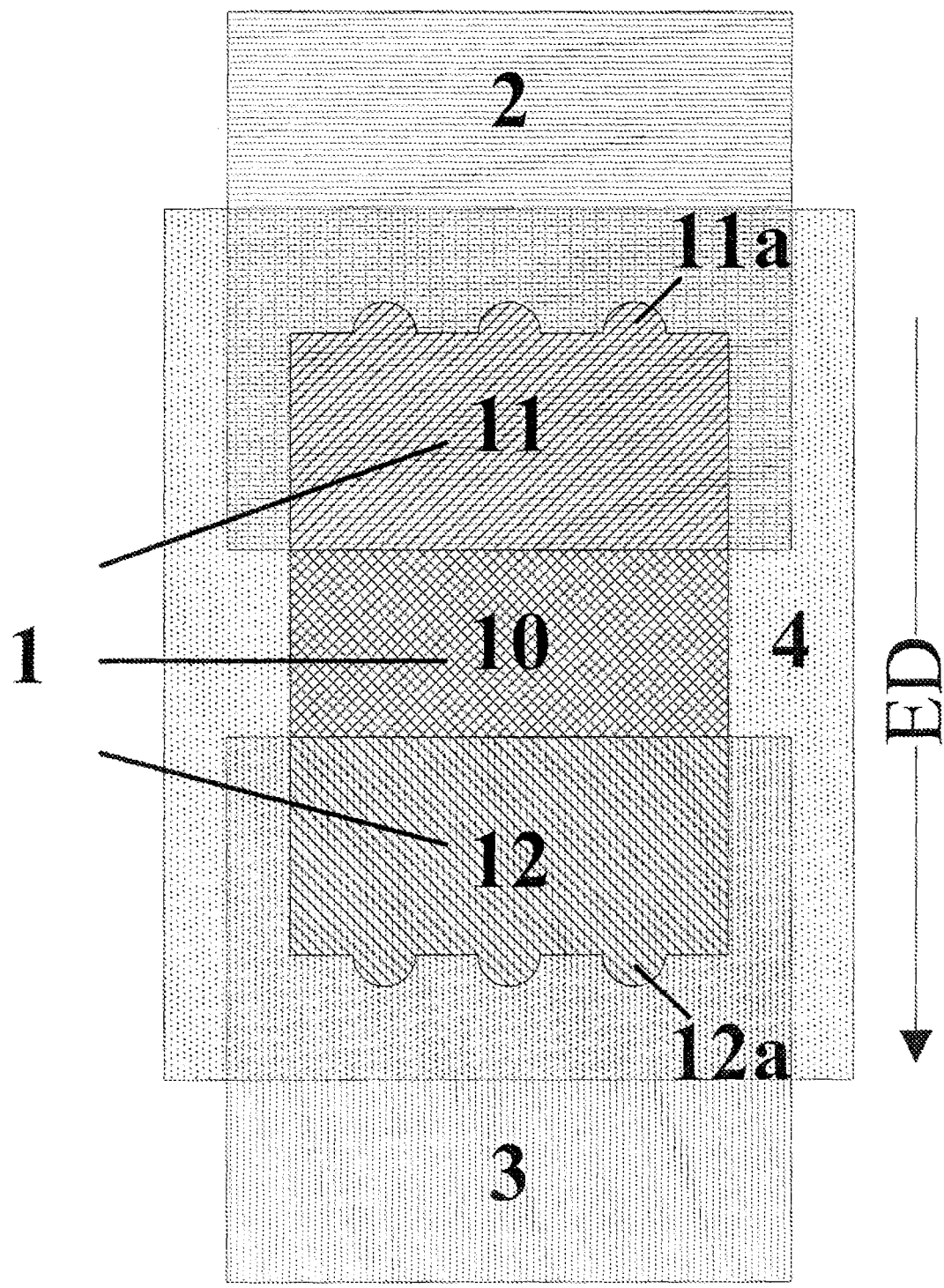
FIG. 3 is a schematic diagram illustrating the structure of an active layer of a thin film transistor in some embodiments according to the present disclosure.

FIG. 3 is a schematic diagram illustrating the structure of an active layer of a thin film transistor in some embodiments according to the present disclosure. Referring to FIG. 3, the source contact part 11 of the active layer 1 includes a plurality of convex portions 11a along its contacting edge, and the drain contact part 12 of the active layer 1 includes a plurality of convex portions 12a along its contacting edge. The contacting edge of the source contact part 11 may be an edge of the source contact part 11 in contact with the source electrode 2 or in contact with a layer between the source electrode 2 and the source contact part 11 (e.g., an amorphous silicon layer 8 or in general an ohmic contact layer). The contacting edge of the drain contact part 12 may be an edge of the drain contact part 12 in contact with the drain electrode 3 or in contact with a layer between the drain electrode 3 and the drain contact part 12 (e.g., an amorphous silicon layer 8 or in general an ohmic contact layer). The contacting edge as used herein means an edge on a side surface of the source contact part 11 (or the drain contact part 12). In one example, the source contact part 11 has a first surface (e.g., a bottom surface) in contact with the gate insulating layer 6, a second surface (e.g., a top surface) in contact with a layer overlaid the source contact part 11 (e.g., the amorphous silicon layer 8), and a third surface (e.g., the side surface) connecting the first surface and the second surface. The contacting edge of the source contact part 11 is on the third surface. In another example, the drain contact part 12 has a first surface (e.g., a bottom surface) in contact with the gate insulating layer 6, a second surface (e.g., a top surface) in contact with a layer overlaid the drain contact part 12 (e.g., the amorphous silicon layer 8), and a third surface (e.g., the side surface) connecting the first surface and the second surface. The contacting edge of the drain contact part 12 is on the third surface.

As shown in FIG. 3, the active layer 1 extends substantially along an extension direction ED from the source electrode 2 to the drain electrode 3. The plurality of convex portions 11a and the plurality of convex portions 12a can be disposed at any appropriate positions of the active layer 1. In FIG. 3, the one or more irregularities are disposed along a portion of the contacting edge extending along a direction non-parallel to the extension direction ED of the active layer 1. For example, the plurality of convex portions 11a are disposed along a portion of the contacting edge of the source contact part 11 extending along a direction substantially orthogonal to the extension direction ED of the active layer 1; and the plurality of convex portions 12a are disposed along a portion of the contacting edge of the drain contact part 12 extending along a direction substantially orthogonal to the extension direction ED of the active layer 1.

Optionally, the plurality of convex portions 11a protrude away from the contacting edge of the source contact part 11 along a direction substantially parallel to the extension direction ED of the active layer 1. Optionally, the plurality of convex portions 12a protrude away from the contacting edge of the drain contact part 12 along a direction substantially parallel to the extension direction ED of the active layer 1.

In plan view of the thin film transistor, the cross-sections of the one or more irregularities along a plane substantially parallel to a surface (e.g., the top surface or the bottom surface) of the active layer may have any appropriate shape. In FIG. 3, the cross-sections of the plurality of convex portions 11a and the plurality of convex portions 12a have a substantially round shape (e.g., a half circular shape). The contour of the contacting edge of the plurality of convex portions 11a and the plurality of convex portions 12a is smoothly curved. Examples of curved configuration of the contour of the contacting edge of the plurality of convex portions 11a and the plurality of convex portions 12a include S-curve, hyperbola curve, parabola curve, catenary curve, trajectory curve, etc.

Figure 4:
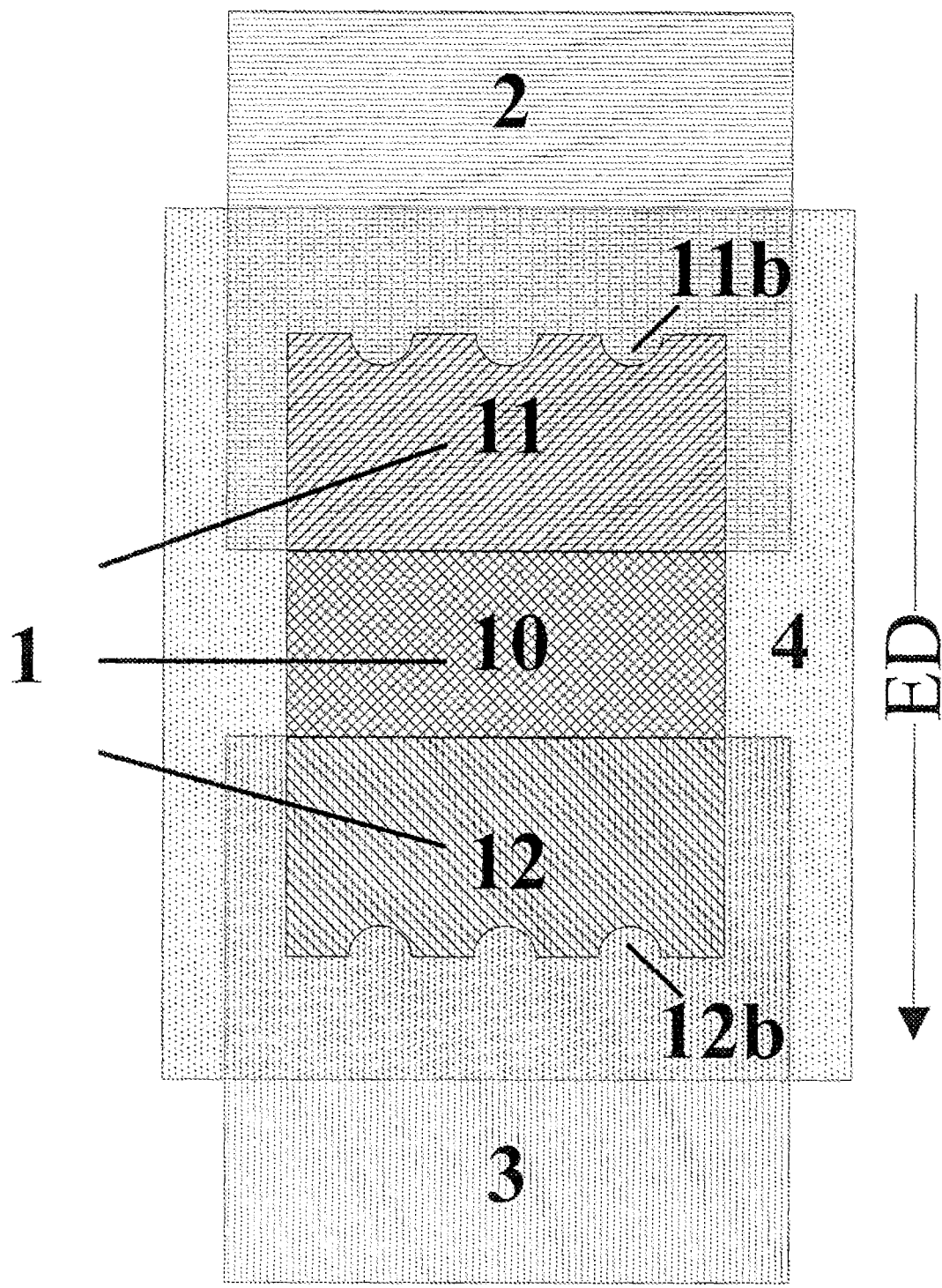
FIG. 4 is a schematic diagram illustrating the structure of an active layer of a thin film transistor in some embodiments according to the present disclosure.

FIG. 4 is a schematic diagram illustrating the structure of an active layer of a thin film transistor in some embodiments according to the present disclosure. Referring to FIG. 4, the source contact part 11 of the active layer 1 includes a plurality of concave portions 11b along its contacting edge, the drain contact part 12 of the active layer includes a plurality of concave portions 12b along its contacting edge. As shown in FIG. 4, the one or more irregularities (e.g., the plurality of concave portions 11b and the plurality of concave portions 12b) are disposed along a portion of the contacting edge extending along a direction non-parallel to the extension direction ED of the active layer 1. For example, the plurality of concave portions 11b are disposed along a portion of the contacting edge of the source contact part 11 extending along a direction substantially orthogonal to the extension direction ED of the active layer 1; and the plurality of concave portions 12b are disposed along a portion of the contacting edge of the drain contact part 12 extending along a direction substantially orthogonal to the extension direction ED of the active layer 1. Optionally, the plurality of concave portions 11b depress from the contacting edge of the source contact part 11 along a direction substantially parallel to the extension direction ED of the active layer 1. Optionally, the plurality of concave portions 12b depress from the contacting edge of the drain contact part 12 along a direction substantially parallel to the extension direction ED of the active layer 1. In FIG. 4 in plan view of the thin film transistor, the cross-sections of the plurality of concave portions 11b and the plurality of concave portions 12b along a plane substantially parallel to a surface of the active layer have a substantially round shape (e.g., a half circular shape). The contour of the contacting edge of the plurality of concave portions 11b and the plurality of concave portions 12b is smoothly curved.

Figure 5:
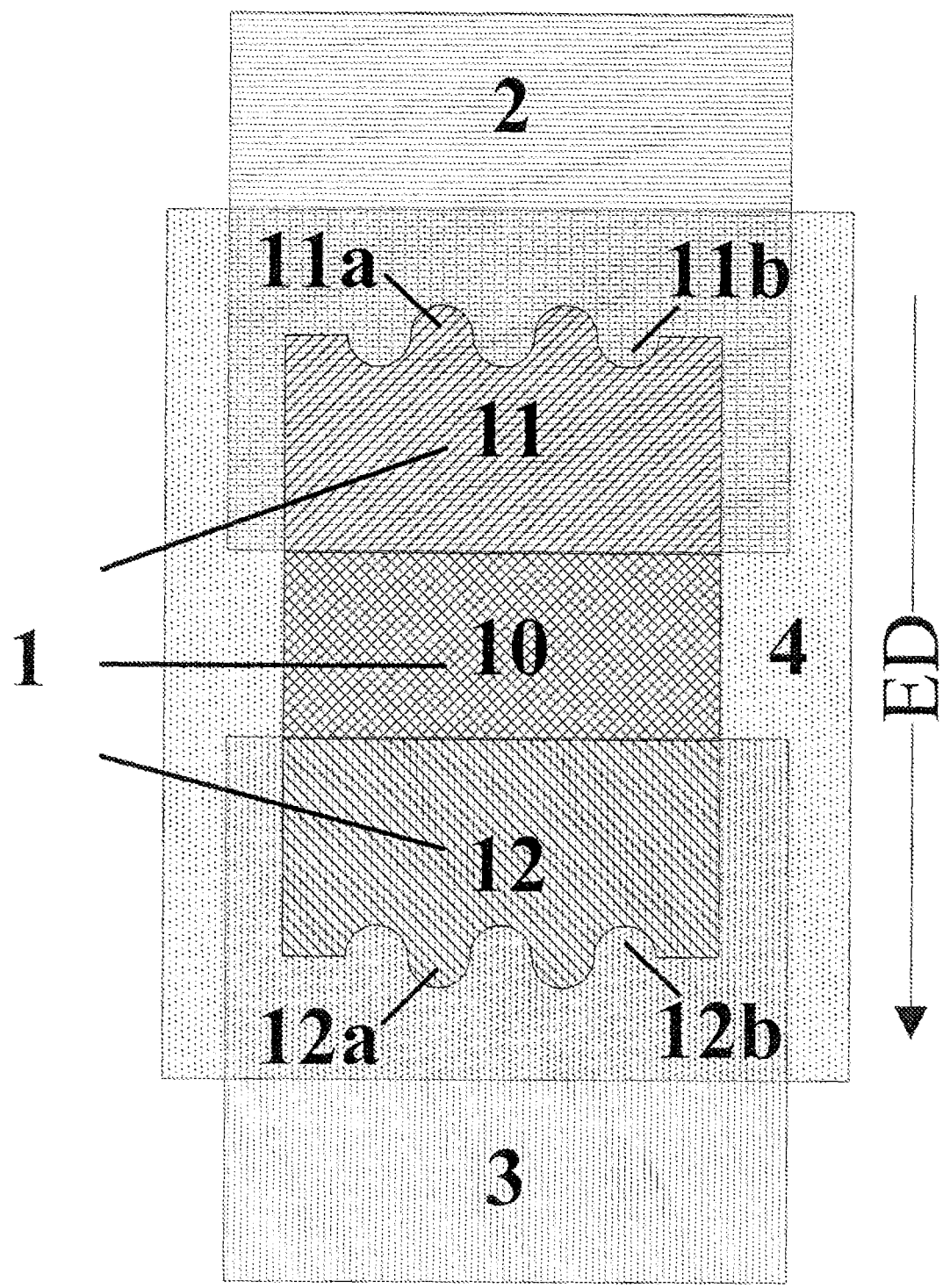
FIG. 5 is a schematic diagram illustrating the structure of an active layer of a thin film transistor in some embodiments according to the present disclosure.

FIG. 5 is a schematic diagram illustrating the structure of an active layer of a thin film transistor in some embodiments according to the present disclosure. Referring to FIG. 5, the source contact part 11 of the active layer 1 includes a plurality of convex portions 11a and a plurality of concave portions 11b along its contacting edge, the drain contact part 12 of the active layer includes a plurality of convex portions 12a and a plurality of concave portions 12b along its contacting edge. As shown in FIG. 5, the one or more irregularities (the plurality of convex portions 11a, the plurality of concave portions 11b, the plurality of convex portions 12a, and the plurality of concave portions 12b) are disposed along a portion of the contacting edge extending along a direction non-parallel to the extension direction ED of the active layer 1. For example, the plurality of convex portions 11a and the plurality of concave portions 11b are disposed along a portion of the contacting edge of the source contact part 11 extending along a direction substantially orthogonal to the extension direction ED of the active layer 1; and the plurality of convex portions 12a and the plurality of concave portions 12b are disposed along a portion of the contacting edge of the drain contact part 12 extending along a direction substantially orthogonal to the extension direction ED of the active layer 1. Optionally, the plurality of convex portions 11a protrude away from the contacting edge of the source contact part 11 along a direction substantially parallel to the extension direction ED of the active layer 1. Optionally, the plurality of concave portions 11b depress from the contacting edge of the source contact part 11 along a direction substantially parallel to the extension direction ED of the active layer 1. Optionally, the plurality of convex portions 12a protrude away from the contacting edge of the drain contact part 12 along a direction substantially parallel to the extension direction ED of the active layer 1. Optionally, the plurality of concave portions 12b depress from the contacting edge of the drain contact part 12 along a direction substantially parallel to the extension direction ED of the active layer 1. In FIG. 5, in plan view of the thin film transistor, the cross-sections of the plurality of convex portions 11a, the plurality of concave portions 11b, the plurality of convex portions 12a, and the plurality of concave portions 12b along a plane substantially parallel to a surface of the active layer have a substantially round shape (e.g., a half circular shape). The contour of the contacting edge of the plurality of convex portions 11a, the plurality of concave portions 11b, the plurality of convex portions 12a, and the plurality of concave portions 12b is smoothly curved.

Optionally, the one or more irregularities comprise alternating concave portions and convex portions. As shown in FIG. 5, the plurality of convex portions 11a and the plurality of concave portions 11b are alternating concave portions and convex portions, and the plurality of convex portions 12a and the plurality of concave portions 12b are alternating concave portions and convex portions.

Figure 6:
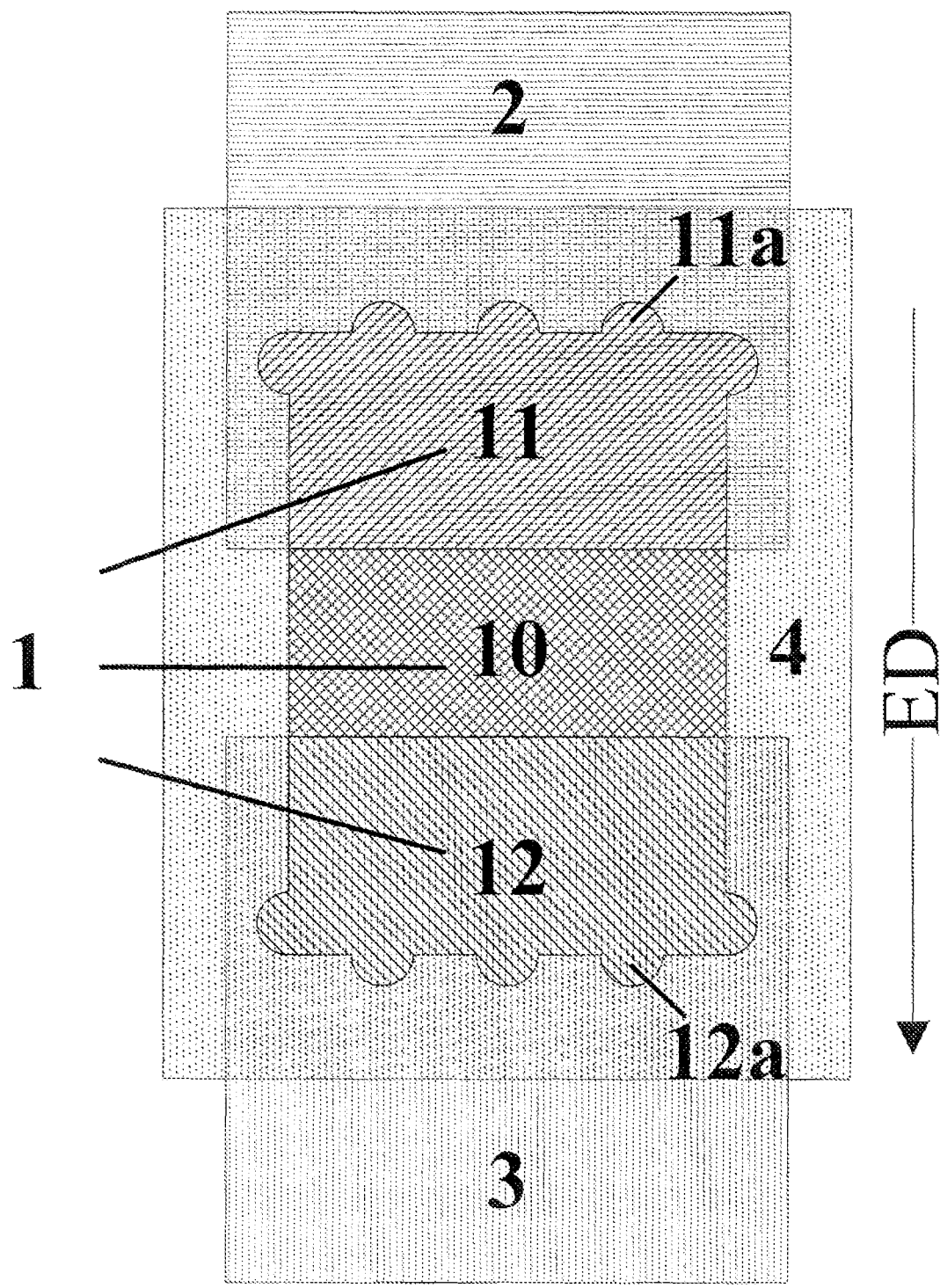
FIG. 6 is a schematic diagram illustrating the structure of an active layer of a thin film transistor in some embodiments according to the present disclosure.

FIG. 6 is a schematic diagram illustrating the structure of an active layer of a thin film transistor in some embodiments according to the present disclosure. Referring to FIG. 6, the source contact part 11 of the active layer 1 includes a plurality of convex portions 11a along its contacting edge, the drain contact part 12 of the active layer includes a plurality of convex portions 12a along its contacting edge. As shown in FIG. 6, the one or more irregularities (e.g., the plurality of convex portions 11a and the plurality of convex portions 12a) are disposed along a first portion of the contacting edge extending along a direction non-parallel to the extension direction ED of the active layer 1, and along a second portion of the contacting edge extending along a direction substantially parallel to the extension direction ED of the active layer 1.

For example, the plurality of convex portions 11a are disposed along a first portion of the contacting edge (e.g., upper portion of the contacting edge in FIG. 6) of the source contact part 11 extending along a direction substantially orthogonal to the extension direction ED of the active layer 1; and along a second portion of the contacting edge (e.g., left and right portions of the contacting edge in FIG. 6) of the source contact part 11 extending along a direction substantially parallel to the extension direction ED of the active layer 1. The plurality of convex portions 12a are disposed along a first portion of the contacting edge (e.g., bottom portion of the contacting edge in FIG. 6) of the drain contact part 12 extending along a direction substantially orthogonal to the extension direction ED of the active layer 1; and along a second portion of the contacting edge (e.g., left and right portions of the contacting edge in FIG. 6) of the drain contact part 12 extending along a direction substantially parallel to the extension direction ED of the active layer 1.

Optionally, the plurality of convex portions 11a along the first portion of the contacting edge of the source contact part 11 protrude away from the first portion of the contacting edge of the source contact part 11 along a direction substantially parallel to the extension direction ED of the active layer 1. Optionally, the plurality of convex portions 11a along the second portion of the contacting edge of the source contact part 11 protrude away from the second portion of the contacting edge of the source contact part 11 along a direction substantially orthogonal to the extension direction ED of the active layer 1. Optionally, the plurality of convex portions 12a along the first portion of the contacting edge of the drain contact part 12 protrude away from the first portion of the contacting edge of the drain contact part 12 along a direction substantially parallel to the extension direction ED of the active layer 1. Optionally, the plurality of convex portions 12a along the second portion of the contacting edge of the drain contact part 12 protrude away from the second portion of the contacting edge of the drain contact part 12 along a direction substantially orthogonal to the extension direction ED of the active layer 1.

In FIG. 6, in plan view of the thin film transistor, the cross-sections of the plurality of convex portions 11a and the plurality of convex portions 12a along a plane substantially parallel to a surface of the active layer have a substantially round shape (e.g., a half circular shape). The contour of the contacting edge of the plurality of convex portions 11a and the plurality of convex portions 12a is smoothly curved.

Figure 7:
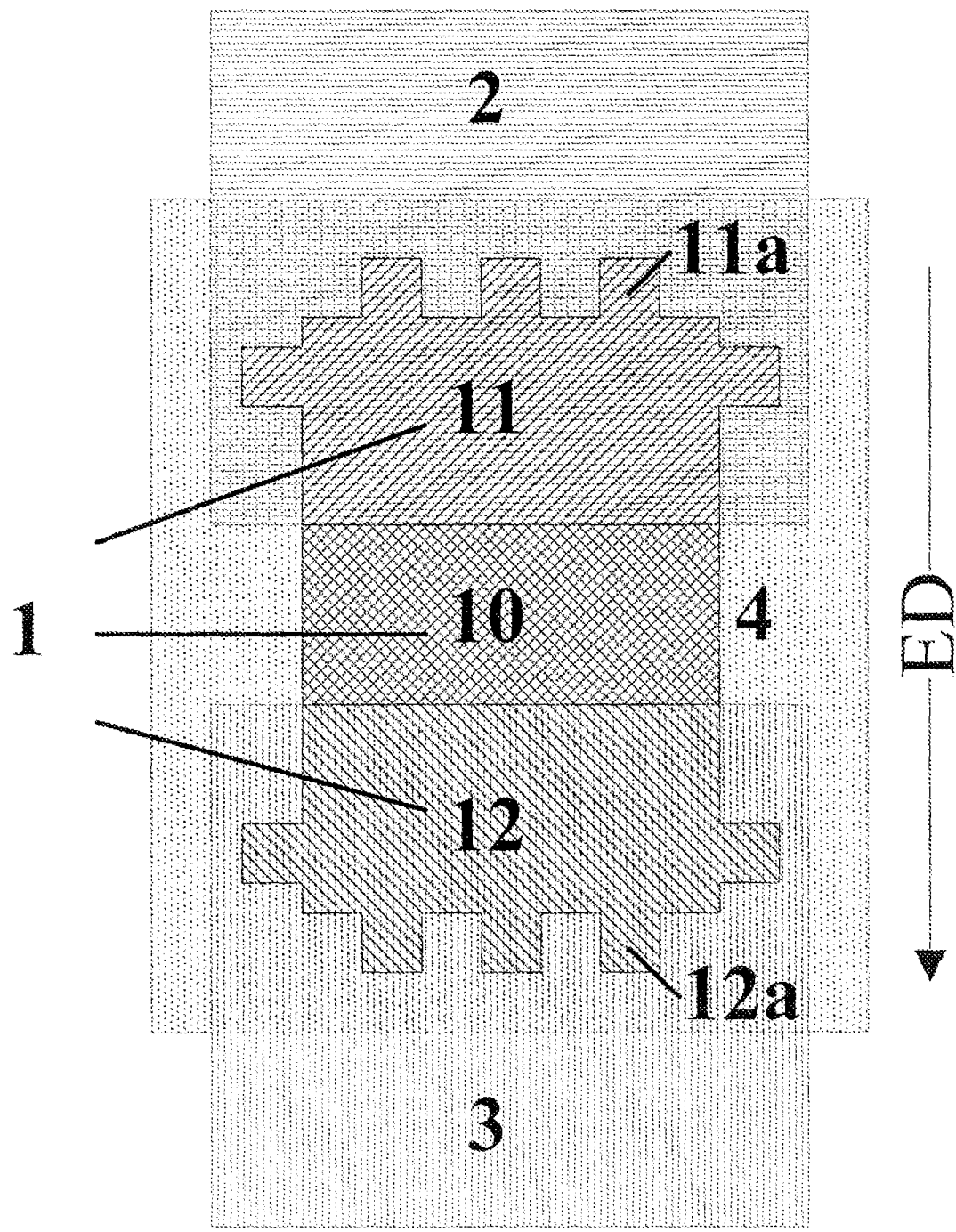
FIG. 7 is a schematic diagram illustrating the structure of an active layer of a thin film transistor in some embodiments according to the present disclosure.

FIG. 7 is a schematic diagram illustrating the structure of an active layer of a thin film transistor in some embodiments according to the present disclosure. The structure of the thin film transistor in FIG. 7 is similar to that of the thin film transistor depicted in FIG. 6. In plan view of the thin film transistor, the cross-sections of the plurality of convex portions 11a and the plurality of convex portions 12a in FIG. 7 along a plane substantially parallel to a surface of the active layer 1, however, have a substantially polygonal shape. The contour of the contacting edge of the plurality of convex portions 11a and the plurality of convex portions 12a is non-smoothly curved. Optionally, the cross-sections of the plurality of convex portions 11a and the plurality of convex portions 12a have a square shape or a rectangular shape.

In FIGS. 3 to 7, the plurality of convex portions 11a have a substantially uniform size and dimension, the plurality of convex portions 12a have a substantially uniform size and dimension, the plurality of concave portions 11b have a substantially uniform size and dimension, and the plurality of concave portions 12b have a substantially uniform size and dimension.

Figure 8:
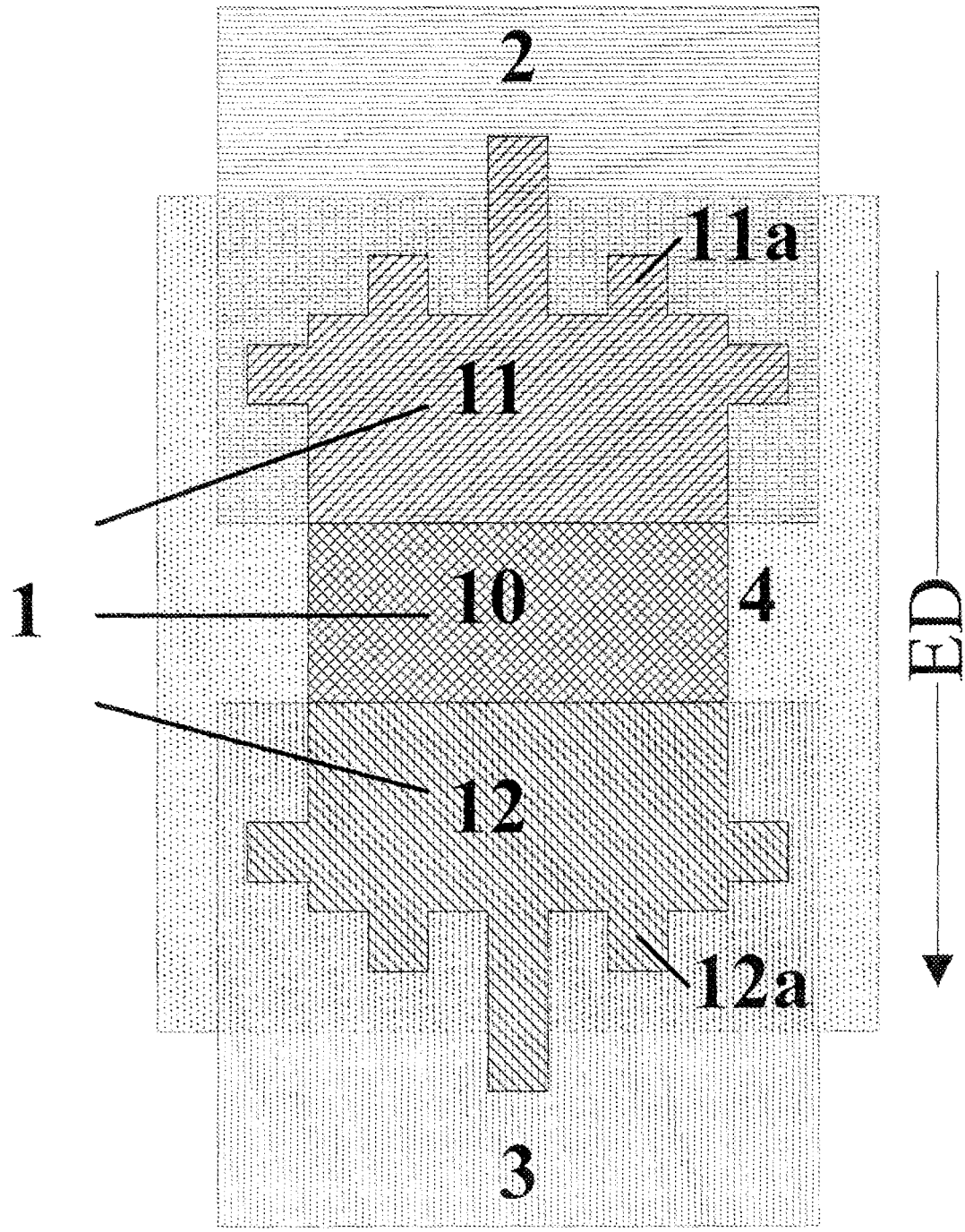
FIG. 8 is a schematic diagram illustrating the structure of an active layer of a thin film transistor in some embodiments according to the present disclosure.

FIG. 8 is a schematic diagram illustrating the structure of an active layer of a thin film transistor in some embodiments according to the present disclosure. Referring to FIG. 8, the source contact part 11 of the active layer 1 includes a plurality of convex portions 11a along its contacting edge; and the drain contact part 12 of the active layer includes a plurality of convex portions 12a along its contacting edge. The plurality of convex portions 11a have non-uniform sizes and dimensions; and the plurality of convex portions 12a have non-uniform sizes and dimensions. By having this design, the contacting area of the contacting edges of the source contact part 11 and the drain contact part 12 can be further enhanced.

Various appropriate semiconductor materials may be used for making the active layer 1. Examples of semiconductor materials for making the active layer 1 include polycrystalline silicon, amorphous silicon, metal oxides, various organic semiconductor materials, and single crystal silicon.

Optionally, the thin film transistor is a top gate-type thin film transistor. Optionally, the top gate-type thin film transistor includes an active layer on a base substrate, a source electrode and a drain electrode on a side of the active layer distal to the base substrate, a gate insulating layer on a side of the source electrode and the drain electrode distal to the active layer, and a gate electrode on a side of the gate insulating layer distal to the active layer.

Optionally, the thin film transistor is a bottom gate-type thin film transistor. Optionally, the bottom gate-type thin film transistor includes a gate electrode on a base substrate, a gate insulating layer on a side of the gate electrode distal to the base substrate, an active layer on a side of the gate insulating layer distal to the gate electrode, and a source electrode and a drain electrode on a side of the active layer distal to the gate electrode.

In another aspect, the present disclosure provides a method of fabricating a thin film transistor. In some embodiments, the method includes forming an active layer having a channel part, a source contact part, and a drain contact part. Optionally, at least one of the source contact part and the drain contact part is formed to have a contacting edge having one or more irregularities along the contacting edge. Optionally, both the source contact part and the drain contact part are formed to have the contacting edge having the one or more irregularities along the contacting edge. Optionally, the one or more irregularities include one or more concave portions along the contacting edge. Optionally, the one or more irregularities include one or more convex portions along the contacting edge. Optionally, the one or more irregularities include a combination of one or more concave portions and one or more convex portions along the contacting edge. Optionally, the one or more irregularities include alternating concave portions and convex portions along the contacting edge.

In some embodiments, the method further includes forming a source electrode on the active layer and forming a drain electrode on the active layer. Optionally, the active layer is formed so that the contacting edge of the source contact part is electrically connected to the source electrode, and the contacting edge of the drain contact part is electrically connected to the drain electrode. Optionally, the active layer is formed so that the contacting edge of the source contact part is in contact with the source electrode, and the contacting edge of the drain contact part is in contact with the drain electrode.

In some embodiments, the method further includes forming an amorphous silicon layer. Optionally, the amorphous silicon layer is formed so that the amorphous silicon layer is between the source electrode and the contacting edge of the source contact part and between the drain electrode and the contacting edge of the drain contact part. Optionally, the amorphous silicon layer is formed so that the contacting edge of the source contact part and the contacting edge of the drain contact part are in contact with the amorphous silicon layer.

In some embodiments, the method further includes forming an n+ doped amorphous silicon layer. Optionally, n+ doped amorphous silicon layer is formed so that the n+ doped amorphous silicon layer is between the amorphous silicon layer and the source electrode and between the amorphous silicon layer and the drain electrode.

In some embodiments, the active layer is formed to extend substantially along an extension direction from the source electrode to the drain electrode. Optionally, the one or more irregularities are formed along a portion of the contacting edge extending along a direction non-parallel to the extension direction of the active layer. Optionally, the one or more irregularities are formed along a portion of the contacting edge extending along a direction substantially orthogonal to the extension direction of the active layer. Optionally, the one or more irregularities are formed along a portion of the contacting edge extending along a direction substantially parallel to the extension direction of the active layer. Optionally, the one or more irregularities are formed along a first portion of the contacting edge extending along a direction non-parallel to the extension direction of the active layer and along a second portion of the contacting edge extending along a direction substantially parallel to the extension direction of the active layer. Optionally, the one or more irregularities are formed along a first portion of the contacting edge extending along a direction substantially orthogonal to the extension direction of the active layer and along a second portion of the contacting edge extending along a direction substantially parallel to the extension direction of the active layer.

In some embodiments, the active layer is formed so that a cross-section of at least one of the one or more irregularities along a plane substantially parallel to a surface of the active layer have a polygonal shape. In some embodiments, the active layer is formed so that a cross-section of at least one of the one or more irregularities along a plane substantially parallel to a surface of the active layer have a round shape.

In some embodiments, the method further includes forming a gate electrode on a base substrate; and forming a gate insulating layer on a side of the gate electrode distal to the base substrate. Optionally, the active layer is formed on a side of the gate insulating layer distal to the gate electrode.

Figure 9A:
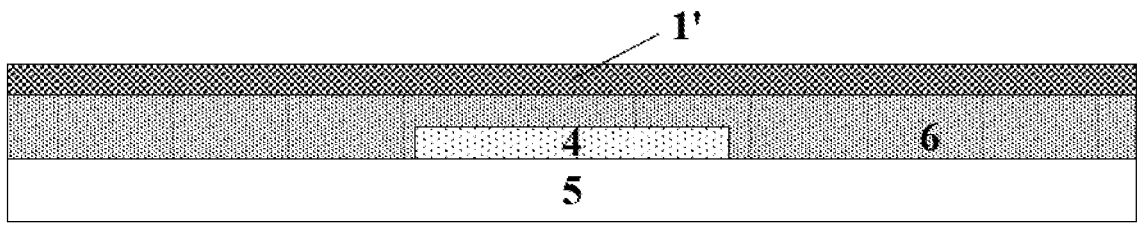
FIGS. 9A to 9E illustrate a process of fabricating a thin film transistor in some embodiments according to the present disclosure.
Figure 9B:
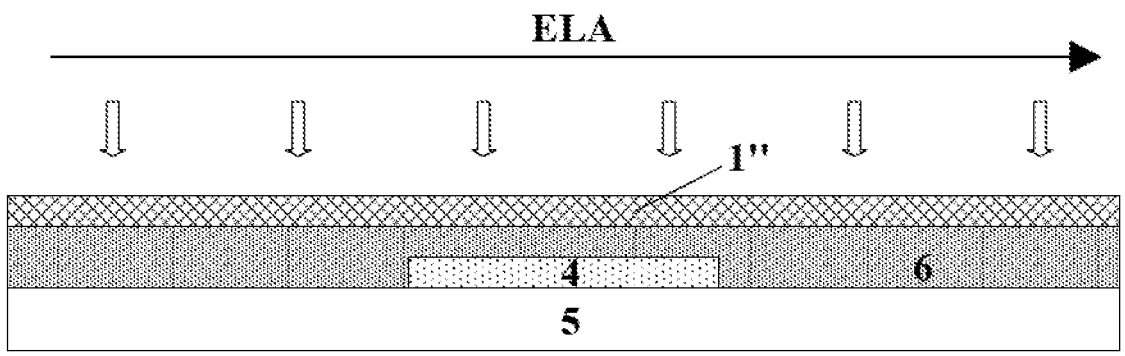
Figure 9C:
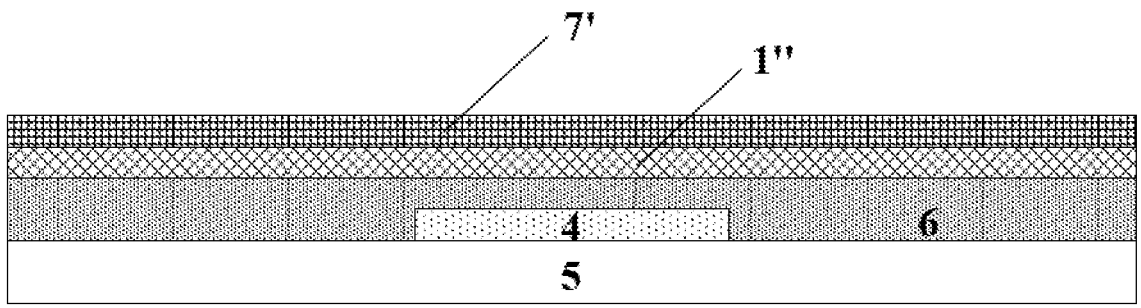
Figure 9D:
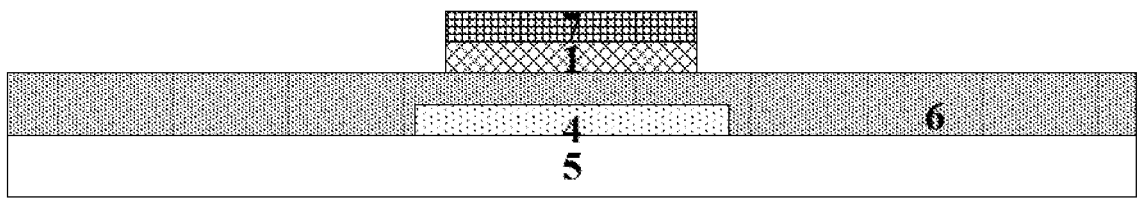
Figure 9E:
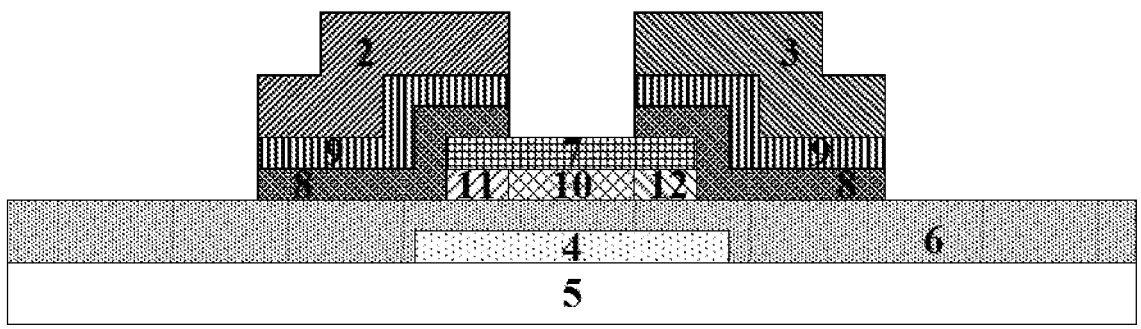

FIGS. 9A to 9E illustrate a process of fabricating a thin film transistor in some embodiments according to the present disclosure. Referring to FIG. 9A, a gate electrode 4 is formed on a base substrate 5, a gate insulating layer 6 is formed on a side of the gate electrode 4 distal to the base substrate 5, and a first amorphous silicon material layer 1' is formed on a side of the gate insulating layer 6 distal to the base substrate 5. Referring to FIG. 9B, the first amorphous silicon material layer 1' is crystallized to form a polycrystalline silicon material layer 1". The crystallization process may be performed by, e.g., an excimer laser annealing (ELA) process. Referring to FIG. 9C, an etch stop material layer 7' is formed on a side of the polycrystalline silicon material layer 1" distal to the gate insulating layer 6. Referring to FIG. 9I), the etch stop material layer 7' and the polycrystalline silicon material layer 1" are patterned to formed an active layer 1 and an etch stop layer 7. The patterning may be performed using a lithography process. The etch stop layer 7 is formed so that an orthographic projection of the etch stop layer 7 on the base substrate 5 substantially overlaps with an orthographic projection of the active layer 1 on the base substrate 5. Referring to FIG. 9E, an amorphous silicon layer 8 is formed on a side of the etch stop layer 7, the active layer 1, and the gate insulating layer 6 distal to the base substrate 5. An n+ doped amorphous silicon layer 9 is formed on a side of the amorphous silicon layer 8 distal to the base substrate 5. A source electrode 2 and a drain electrode 3 are then formed on a side of the n+ doped amorphous silicon layer 9 distal to the amorphous silicon layer 8.

In another aspect, the present disclosure provides a display apparatus having a thin film transistor described herein or fabricated by a method described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor, comprising:
an active layer having a channel part, a source contact part, and a drain contact part; and
a source electrode and a drain electrode on the active layer;
wherein at least one of the source contact part and the drain contact part has a contacting edge having one or more irregularities along the contacting edge;
the contacting edge of the source contact part is electrically connected to the source electrode; and
the contacting edge of the drain contact part is electrically connected to the drain electrode;
the active layer extends along an extension direction from the source electrode to the drain electrode; and
the one or more irregularities are along a first portion of the contacting edge extending along a direction non-parallel to the extension direction of the active layer and along a second portion of the contacting edge extending along a direction parallel to the extension direction of the active layer.

2. The thin film transistor of claim 1, wherein the one or more irregularities comprise one or more concave portions along the contacting edge, one or more convex portions along the contacting edge, or a combination of one or more concave portions and one or more convex portions along the contacting edge.

3. The thin film transistor of claim 2, wherein the one or more irregularities comprise alternating concave portions and convex portions along the contacting edge.

4. The thin film transistor of claim 1, wherein both the source contact part and the drain contact part have the contacting edge having the one or more irregularities along the contacting edge.

5. The thin film transistor of claim 1, further comprising a source electrode and a drain electrode on the active layer;
wherein the contacting edge of the source contact part is electrically connected to the source electrode; and
the contacting edge of the drain contact part is electrically connected to the drain electrode.

6. The thin film transistor of claim 1, wherein the contacting edge of the source contact part is in contact with the source electrode; and
the contacting edge of the drain contact part is in contact with the drain electrode.

7. The thin film transistor of claim 1, further comprising an amorphous silicon layer between the source electrode and the contacting edge of the source contact part and between the drain electrode and the contacting edge of the drain contact part;
wherein the contacting edge of the source contact part and the contacting edge of the drain contact part are in contact with the amorphous silicon layer.

8. The thin film transistor of claim 7, further comprising an n+ doped amorphous silicon layer between the amorphous silicon layer and the source electrode and between the amorphous silicon layer and the drain electrode.

9. The thin film transistor of claim 1, wherein a cross-section of at least one of the one or more irregularities along a plane parallel to a surface of the active layer have a polygonal shape.

10. The thin film transistor of claim 1, wherein a cross-section of at least one of the one or more irregularities along a plane parallel to a surface of the active layer have a round shape.

11. The thin film transistor of claim 1, wherein the thin film transistor is a bottom gate-type thin film transistor comprising:
  a gate electrode on a base substrate; and
  a gate insulating layer on a side of the gate electrode distal to the base substrate;
  wherein the active layer is on a side of the gate insulating layer distal to the gate electrode.

12. The thin film transistor of claim 1, further comprising an etch stop layer on the channel part.

13. The thin film transistor of claim 1, further comprising an etch stop layer on the active layer and conformal with the source contact part and the drain contact part.

14. The thin film transistor of claim 1, wherein the active layer comprises a metal oxide semiconductor material.

15. The thin film transistor of claim 1, wherein the active layer comprises an amorphous silicon or a polycrystalline silicon.

16. A display apparatus, comprising the thin film transistor of claim 1.

17. A thin film transistor, comprising:
  an active layer having a channel part, a source contact part, and a drain contact part;
  a source electrode and a drain electrode on the active layer;
  wherein at least one of the source contact part and the drain contact part has a contacting edge having one or more irregularities along the contacting edge;
  the contacting edge of the source contact part is electrically connected to the source electrode;
  the contacting edge of the drain contact part is electrically connected to the drain electrode:
  the active layer extends along an extension direction from the source electrode to the drain electrode; and
  the one or more irregularities are along a portion of the contacting edge extending along a direction parallel to the extension direction of the active layer.

* * * * *